(12) United States Patent
Eklund et al.

(10) Patent No.: US 11,031,480 B2
(45) Date of Patent: Jun. 8, 2021

(54) SEMICONDUCTOR DEVICE, COMPRISING AN INSULATED GATE FIELD EFFECT TRANSISTOR CONNECTED IN SERIES WITH A FIELD EFFECT TRANSISTOR

(71) Applicant: K. Eklund Innovation, Uppsala (SE)

(72) Inventors: Klas-Håkan Eklund, Uppsala (SE); Lars Vestling, Södertälje (SE)

(73) Assignee: K. EKLUND INNOVATION, Uppsala (SE)

( * ) Notice: Subject to any disclaimer, the term of this patent is extended or adjusted under 35 U.S.C. 154(b) by 0 days.

(21) Appl. No.: 16/570,373

(22) Filed: Sep. 13, 2019

(65) Prior Publication Data

US 2021/0083066 A1     Mar. 18, 2021

(51) Int. Cl.
*H01L 21/02* (2006.01)
*H01L 29/49* (2006.01)
(Continued)

(52) U.S. Cl.
CPC ...... *H01L 29/4983* (2013.01); *H01L 29/0696* (2013.01); *H01L 29/0856* (2013.01);
(Continued)

(58) Field of Classification Search
CPC ............. H01L 29/4983; H01L 29/0696; H01L 29/0856; H01L 29/0873; H01L 29/66681; H01L 29/7394; H01L 29/7835; H01L 29/872; H01L 21/8234–8249; H01L 29/66477–6684; H01L 29/78–7926; H01L 29/1033–1054; H01L 29/04–045; H01L 29/16–1608; H01L 29/18–185; H01L 29/20–2006; H01L 29/22–2206; H01L 29/36–365; H01L 21/82345;
(Continued)

(56) References Cited

U.S. PATENT DOCUMENTS 4,811,075 A * 3/1989 Eklund ................. H01L 27/085
                                                       257/369
5,313,082 A   5/1994 Eklund
(Continued)

OTHER PUBLICATIONS

Disney et al.; High-Voltage Integrated Circuits: History, State of the Art, and Future Prospects; IEEE Transactions on Electron Devices; Mar. 2017; vol. 64, No. 3; pp. 659-673.

*Primary Examiner* — Calvin Y Choi
(74) *Attorney, Agent, or Firm* — Nixon & Vanderhye

(57) ABSTRACT

A semiconductor device is provided that includes an insulated gate field effect transistor series connected with a FET having several parallel conductive layers, a substrate of first conductivity type extending under both transistors, and a first layer of a second conductivity type overlies the substrate. Above this first layer are several conductive layers with channels formed by several of the first conductivity type doped epitaxial layers with layers of a first conductivity type on both sides. The uppermost layer of the device may be substantially thicker than the directly underlying parallel conductive layers. The JFET is isolated with deep poly trenches of second conductivity type on the source side. The insulated gate field effect transistor is isolated with deep poly trenches of the first conductivity type on both sides. A further isolated region is isolated with deep poly trenches of the first conductivity type on both sides.

20 Claims, 10 Drawing Sheets

(51) Int. Cl.
*H01L 29/872* (2006.01)
*H01L 29/739* (2006.01)
*H01L 29/66* (2006.01)
*H01L 29/08* (2006.01)
*H01L 29/78* (2006.01)
*H01L 29/06* (2006.01)

(52) U.S. Cl.
CPC .... *H01L 29/0873* (2013.01); *H01L 29/66681* (2013.01); *H01L 29/7394* (2013.01); *H01L 29/7835* (2013.01); *H01L 29/872* (2013.01)

(58) Field of Classification Search
CPC ..... H01L 21/823456; H01L 21/823462; H01L 21/8236; H01L 21/823842; H01L 21/82385; H01L 21/823857; H01L 27/0617–0623; H01L 27/0635; H01L 27/0705–0722; H01L 27/085–098; H01L 27/105–11597; H01L 27/02–098; H01L 27/0266–0285; H01L 27/0623; H01L 27/0629–0635; H01L 27/0711–0738; H01L 29/1058; H01L 29/1066; H01L 29/66893–66924; H01L 29/8086; H01L 2924/13062; H01L 27/098; H01L 27/14679

See application file for complete search history.

(56) References Cited

U.S. PATENT DOCUMENTS

| | | | |
|---|---|---|---|
| 5,891,776 A * | 4/1999 | Han | H01L 29/1095 438/274 |
| 6,168,983 B1 | 1/2001 | Rumennik et al. | |
| 8,264,015 B2 | 9/2012 | Eklund | |
| 2002/0050613 A1* | 5/2002 | Rumennik | H01L 29/7835 257/325 |
| 2015/0155355 A1* | 6/2015 | Losee | H01L 29/66704 257/77 |
| 2017/0170264 A1* | 6/2017 | Mauder | H01L 29/0634 |
| 2018/0174887 A1* | 6/2018 | Chuang | H01L 29/1095 |

* cited by examiner

SEMICONDUCTOR DEVICE, COMPRISING AN INSULATED GATE FIELD EFFECT TRANSISTOR CONNECTED IN SERIES WITH A FIELD EFFECT TRANSISTOR

BACKGROUND OF THE INVENTION

Field of the Invention

The present invention relates to a semiconductor device comprising an insulated gate field-effect transistor connected in series with a field effect transistor with improved voltage and current capability, especially a device having a very low on-resistance. The invention is especially a further development of the applicant's prior application PCT/SE2019/050229, filed on 14 Mar. 2019.

Description of the Related Art

An insulated gate field-effect transistor, such as a MOSFET, internally in silicon connected in series with a JFET has now long been the workhorse of the industry for combining high voltage power devices on the same chip as low voltage analogue and digital functions.

For improving voltage and current capability the evolution has gone from a single sided JFET to a symmetric JFET reducing the on-resistance to half, as obtained e.g. by the U.S. Pat. No. 4,811,075 A, describing an insulated-gate, field-effect transistor and a double-sided, junction-gate field-effect transistor connected in series on the same chip to form a high-voltage MOS transistor, and further developments having a JFET with 2 channels in series further reducing the on-resistance by 30%, as shown in U.S. Pat. No. 5,313,082 A.

The latest patent has been further improved by U.S. Pat. No. 6,168,983 B1, suggesting a JFET with several conductive layers in parallel implemented vertically in the substrate in a common N-well or in an N-type epi layer on top of the substrate. Later it has also been shown that if the serial connection of the insulated gate field-effect transistor and JFET is made externally further reduction of the on-resistance can be made, performance improved at high frequencies, and reliability enhanced, as e.g. described in U.S. Pat. No. 8,264,015 B2. In this patent is also proposed several parallel JFET channels are implemented in a common N-well in series with an insulated gate field-effect transistor of which the size can be optimized for matching the numbers of JFET channels. Due to the external connection this can not be made in U.S. Pat. No. 6,168,983 B1, as the connection is internal in silicon.

The number of parallel conductive layers is practically set by the insulated gate transistor and further by the depth of the N-well, set to 15 μm in the patent. A similar limitation is also present in U.S. Pat. No. 8,264,015 B2, set by implantation energy.

The proposed concept to create multiple conductive layers with ion-implantation has not been that successful as expected, due to very high energy implantation which is a fundamental limitation as noted earlier.

Other limiting problems are radiation damage lowering the mobility and the broadening of the profile of the implanted atoms. State of the art is still 2-3 conductive layers in parallel, e.g. according to Don Disney et al *High-Voltage Integrated Circuits: History, State of the Art, And Future Prospects. IEEE Transactions on Electron Devices*, Vol. 64. No. 3, March 2017.

BRIEF SUMMARY OF THE INVENTION

In the present approach is proposed that the conductive layers are made by epitaxial layers with much better control, no radiation damage. Further As can be used as dopant instead of P in ion-implantation which gives higher mobility. With the epitaxial technique there is no fundamental limitation to the number of conductive layers which can made in parallel.

As the resistance of the conductive layers is known, an estimation of the performance can easily be done as figure of merit Ron*A for a device:

For 6-8 conductive layers is obtained:

For a 230V device Ron*A is around 100 m$\Omega$mm$^2$ as compared to state of the art of 500 m$\Omega$mm$^2$ For a 700V device Ron*A is around 2 $\Omega$*mm$^2$ as compared to state of the art 15 $\Omega$*mm$^2$, e.g. according to Don Disney et al *High-Voltage Integrated Circuits: History, State of the Art, And Future Prospects. IEEE Transactions on Electron Devices*, Vol. 64. No. 3, March 2017.

Area advantage means of course less cost but also drastically reduced capacitances, increased switching speed and much higher efficiency. Even at 1200 V there is a real opportunity to compete with vertical power MOS devices and SiC devices.

All this with a modest number of parallel conductive layers of 6-8. The number of layers can easily be increased, as there are no fundamental limitations, only practical.

BRIEF DESCRIPTION OF THE DRAWINGS

The invention will now be explained further with a help of a couple of non-limiting embodiments, shown on the accompanying drawings, and including the embodiments of the prior application, in which FIG. 1 schematically shows a first embodiment of a semiconductor device according to the prior invention in the form of a MOS transistor in series with a JFET comprising several conductive layers.

DETAILED DESCRIPTION OF THE PREFERRED EMBODIMENTS

Figure 1:
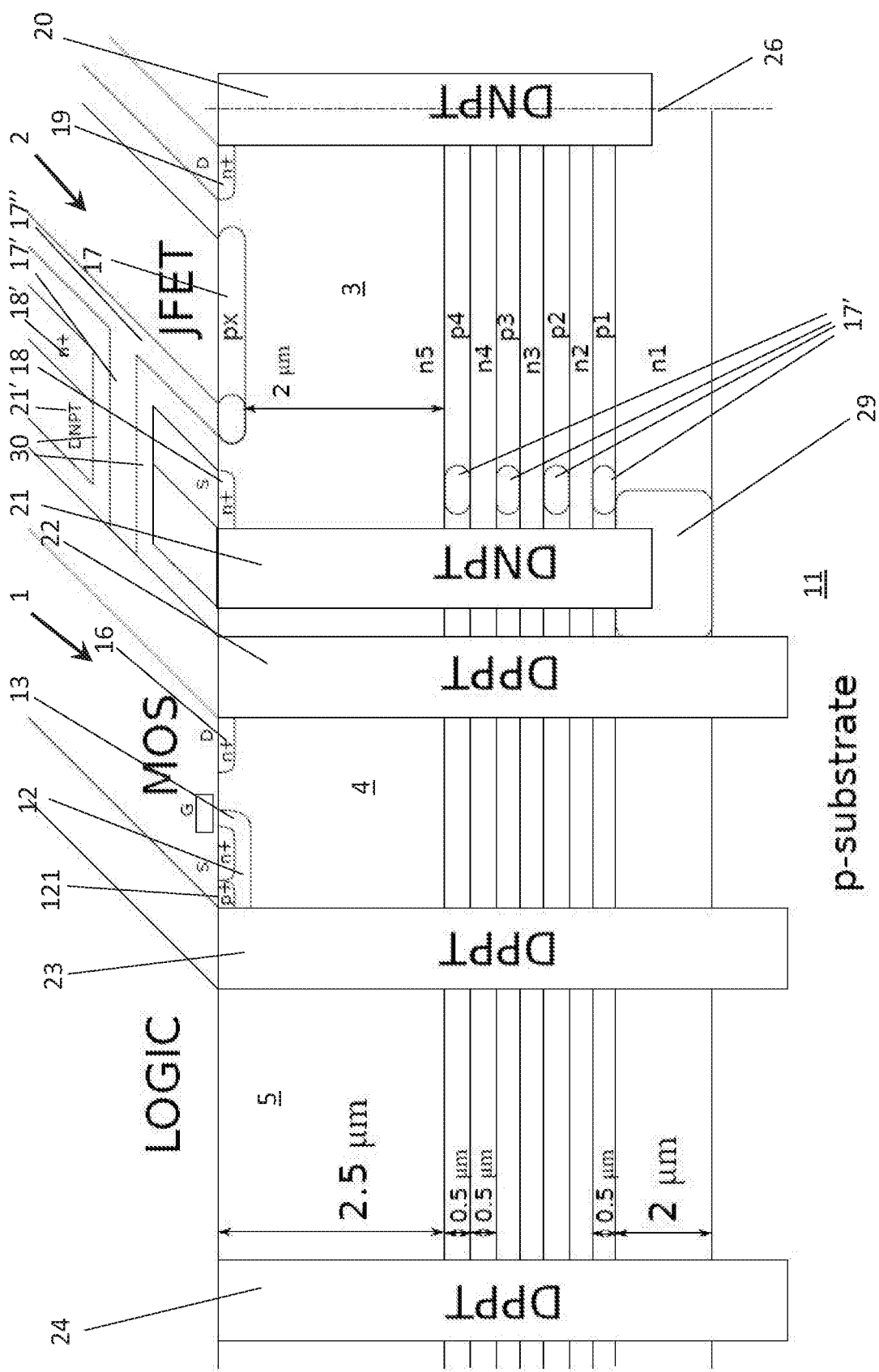

In FIG. 1 is shown a MOS transistor 1 to the left in serial connection with a JFET 2 to the right, which JFET 2 comprises several conductive layers, JFET channels, formed by parallel n-layers n1-n5 as shown in the figure and separated by common p-layers p1-p4, gates. The layers are deposited in situ in an epitaxial reactor or in two reactors where the p-layers are deposited in one and the p-layer in the other reactor. If two reactors are used, it would be a great advantage if the wafers are transported from one to the other under vacuum through interlocks. The first layer starts on top of a p-type substrate, with a resistivity ranging from 10 Ωcm to 135 Ωcm. The thickness and the doping of the layers are determined by the resurf principle, which means that the product of the thickness and doping of a layer should be around $2*10^{12}$ charges/cm$^2$, which means thickness and doping can be varied as long this condition is satisfied.

The first channel region in the figure is chosen to be 2 μm thick with a doping of $1*10^{16}$/cm$^3$, and then satisfies the condition above. The thickness and doping of the following layers are then chosen to be 0.5 μm with a doping of $4*10^{16}$/cm$^3$ and could actually be as many as one like.

As a practical example the number of parallel n-layers n1-n5 is stopped before an n5 epitaxial layer which preferably is made thicker, 2.5 μm, and has a masked implanted px layer 17 as an upper gate with thickness of 0.5 μm and charge of $1*10^{12}$/cm$^2$. The px layer 17 is just acting as gate for the uppermost channel, which makes the channel layer 2 μm thick and having a doping density of $5*10^{15}$/cm$^3$. The channel layers on the drain side are connected together with a deep N-poly trench, DNPT, 20, and so also the channel layers on the source side by a deep N-poly trench, DNPT, 21. The JFET 2 is isolated by a deep P-poly trench, DPPT 22, and on the same time connecting the p-layers p1-p4 which normally will be grounded and with given intervals of about 5 μm abrupt the source DNPT with openings 30 for contacting p-layers p1-p4 in the other direction. In addition to the so formed isolated region 3 of the JFET 2 an additional DPPT 23, can create isolated n-islands, for example 4 and 5 in the figure.

Within an isolated n-region 4 for the MOS transistor 1 a body region 12 of first conductivity type, for example p-type material, is arranged and doped at between $1*10^{17}$ and $1*10^{18}$ atoms per cm$^3$. The body region 12 typically extends to a depth of 1 μm or less below the surface of the device. Within the body region 12 for the MOS transistor 1 a source region 13 of second conductivity type, for example n+ type material doped at between $1*10^{18}$ and $1*10^{20}$ atoms per cm$^3$, is arranged. The source region 13 extends for example 0.4 μm or less below the surface of the device. A body contact region 121 in the body region 12 to the left of source region 13 of first conductivity type doped at between $1*10^{18}$ and $1*10^{20}$ atoms per cm$^3$. The body contact region 121 extends for example 0.4 μm or less below the surface of the device. Both the body region 12 and the body contact region 121 may be electrically connected to the substrate by extending the body region 12 and the body contact region 121 outside a pocket region formed.

A drain contact region 16 for the MOS transistor 1, of second conductivity type, for example n+ type material, is doped at between $1*10^{18}$ and $1*10^{20}$ atoms per cm$^3$. The drain contact region 16 extends, for example 0.4 μm or less below the surface of the device.

Within the isolated region 3 for the JFET 2 a source region 18 and a drain region 19 of second conductivity type, for example n+ type material doped at $1*10^{18}$ and $1*10^{20}$ atoms per cm$^3$ are located. The source region 18 and the drain region 19 extend for example 0.4 μm or less below the surface of the device.

The drain contact 16 of the MOS transistor 1 will be electrically contacted to the source contact 18 of the JFET 2 and thus constitute a MOS transistor 1 in series with a JFET 2.

The breakdown voltage of the device will be determined by the drift region LD, between source region 18 and drain region 19 of the JFET 2, and the substrate resistivity.

Several isolated regions 5 can easily be made as example for logic and analogue control functions.

Even if logic and the MOS device can be implemented as shown in FIG. 1 in isolated p-layers, and as described in the prior application, a p-layer would be much preferable for logic and work as well for the MOS device, and is the object of the present invention.

Figure 7:
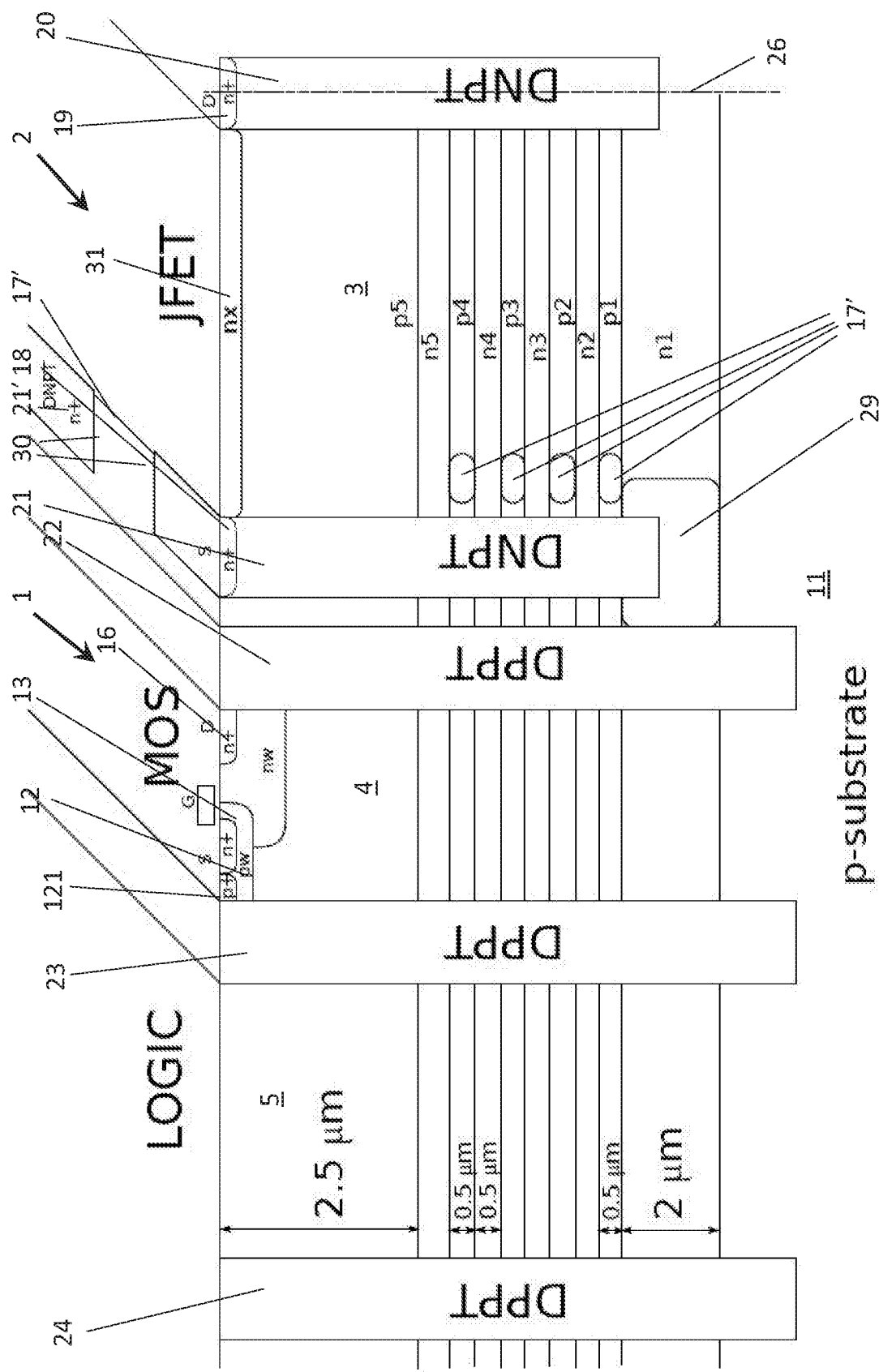
FIG. 7 shows a first embodiment of a semiconductor device according to the present invention in the form of a MOS transistor in series with a JFET comprising several conductive layers, similar to FIG. 1, with a p-type top layer for CMOS compatibility.

In a similar way isolated p-regions can be created see FIG. 7. After p-layer p4 a thin epitaxial n-layer n5 is deposited and then an epitaxial p-layer p5 is deposited which is preferably made thicker, 2.5 μm, and has a masked implanted nx layer 31. As an upper conductive layer with thickness of 0.5 μm and charge of $1*10^{12}$/cm$^2$ the thickness of the underlying p5 layer being 2 μm with a charge of $2*10^{12}$/cm$^2$, which then corresponds to a doping density of $1*10^{16}$/cm$^3$. The p-type regions 4 and 5 will have the same doping density with a thickness of 2.5 μm, this doping density is standard for state of the art CMOS. Older standard for CMOS with starting material p-type doping density of $1*10^{15}$/cm$^3$ can also easily be accomplished by making the p5 epitaxial layer a sandwich with two p-layers, the first 1 μm thick, with doping $2*10^{16}$ and the other on top with thickness 1.5 μm and doping $1*10^{15}$. The masked nx layer 31 should then cover the top part of the p5 layer.

The device can preferably be made symmetric, with a mirror to the right in the drawing, wherein 26 denotes the symmetry line.

An important requirement for the device shown in FIG. 1 to work is that the pinch voltage of any of the FETs in the JFET 2 is lower than the breakthrough voltage of the MOS transistor 1. The pinch voltage will appear on the common source 18 of the FETs and then connected to the drain 16 of the isolated MOS transistor 1. In FIG. 1 is indicated that the first layer n1 on top of the p-substrate 11 is thicker and this is for meeting the requirement for a high breakthrough voltage. For a breakthrough voltage of around 800V the thickness of the layer should be around 6-7 μm and with a pinch voltage of 50V or more. This means that the MOS transistor would stand 50V with good margin. Also a 50V MOS transistor will take up more space with lower performance than a 10V MOS device. It is therefore suggested that the remainder of the n-layers are designed for a 10V pinch voltage to start with, and that the first layer is shielded from the source 18 of the JFET 2 by a shielding layer 29 as shown in FIG. 1.

Figure 8:
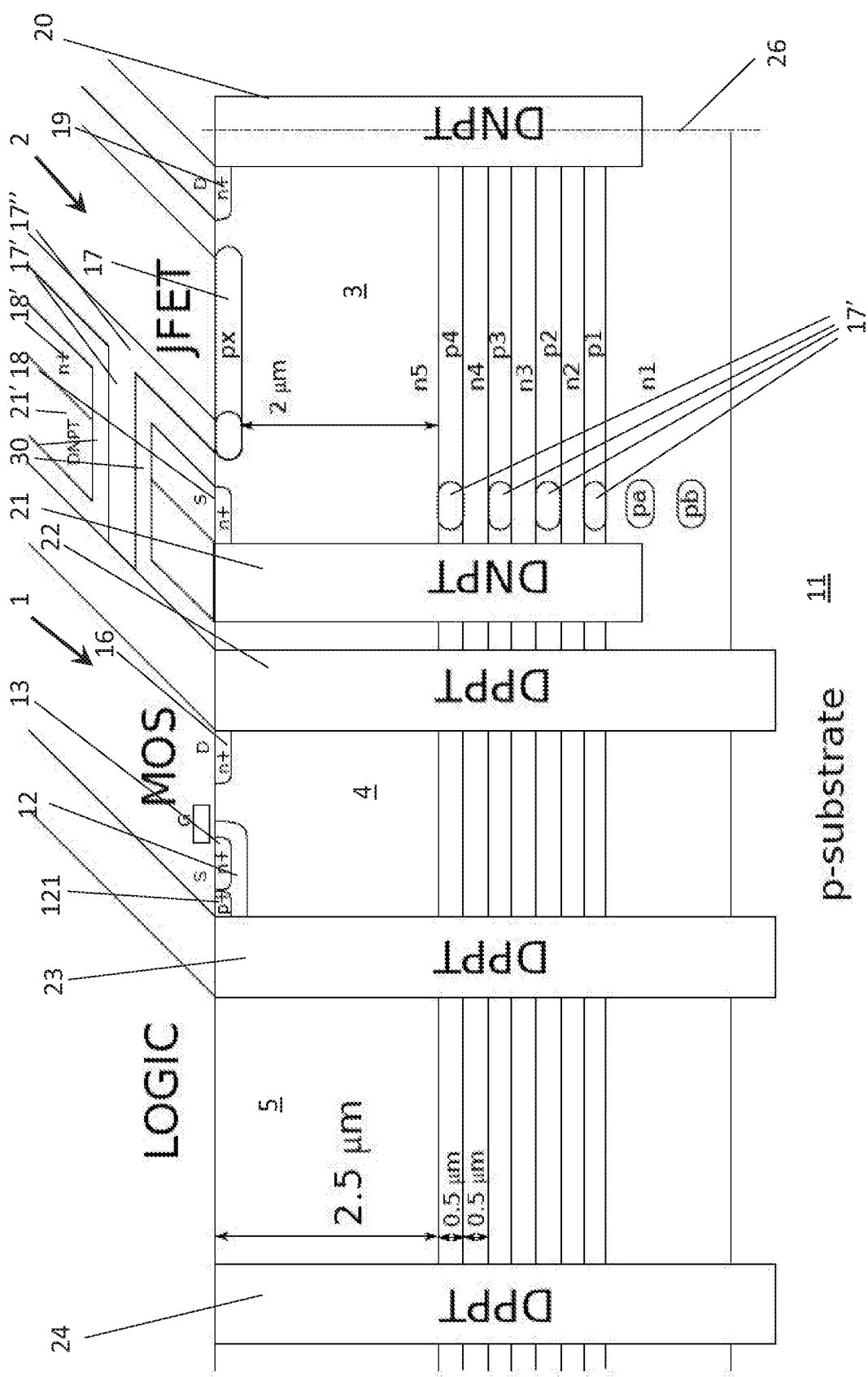
FIG. 8 shows an alternative solution to the device in FIG. 1 with an additional conducting layer in the bottom layer for decreased total resistance.

To then solve the problem that there is no contribution to the current and resistance from the layer n1 it is now proposed to remove the shielding layer 29 and placing a new p region pa in the middle of the n1 layer close to the source which then creates two new channels one on top of pa and the other below pa which both will pinch well below 10 V. The length of pa is about 3 µm and the charge is in the order $1*10^{13}/cm^2$. This is shown in FIG. 8. The two short channels will increase the resistance of the n1 layer from drain to source very marginally (10-15%). In total a fifth conductive layer is added in parallel to previous four reducing on-resistance by about 20%. For still higher breakdown voltages which requires thicker n1 layers it is proposed to adding another p-region pb and possibly more regions pc, etc until required performance is reached.

The pinch voltage, or actually the source voltage, of the common JFETs should be low and constant as the drain voltage of the JFET is increased, e.g. up to 800V. This will not happen as there is an increase of the source voltage when the drain voltage is increased. By increasing the doping in the gate layers p1-p5 close to the JFET source 18 thus forming a shielding area 17" along the edge of the gate layers p1-p5, and so forming a conventional FET in series with a superjunction FET, where the gate layer never will be fully depleted. This will make the source voltage of the JFET 2 constant as the drain voltage of the JFET is increased up to 800V. This will further decrease the important Miller capacitance in the order of magnitude. As the doping in the indicated areas has been increased substantially, it can be used to contact the gate layer to ground much less frequently and increasing the effective width of the JFET. The charge in the shielding area can be in the order of $2*10^{13}/cm^2$.

The gate layers p1-p5 will preferably be grounded by fingers 17' bringing the layer in contact with the DPPT layer 22 in the same area where the DNPT 21 is abrupted by an opening 30 in the mask creating an area where a finger 17' stretches from the gate layer and the n+ source 18, 18' contacting will be disrupted. All gate layers can also be connected by fingers of DPPT stretching from the DPPT 22 in the area where the source DNPT 21 is abrupted for contacting each p-layer p1-p5, thus replacing the finger 17'. The DPPT fingers may contact the p-layers very frequently at every 4-5 µm for a conductive n-layer with thickness around 2 µm and even more frequently for thinner layers. The DPPT fingers will also act as a side gate for the n-layers and will then give about the same performance advantages as the shielding area 17" as described above.

The substrate 11 is of the first conductivity type and usually grounded, as the layers of first conductivity type. When the voltage on the drain, i.e. the n1 layer, increases the layer will be depleted from the substrate and the first p-layer, p1. Thereby the substrate will act as a second gate for the first layer of the second conductivity type, n1.

Figure 2:
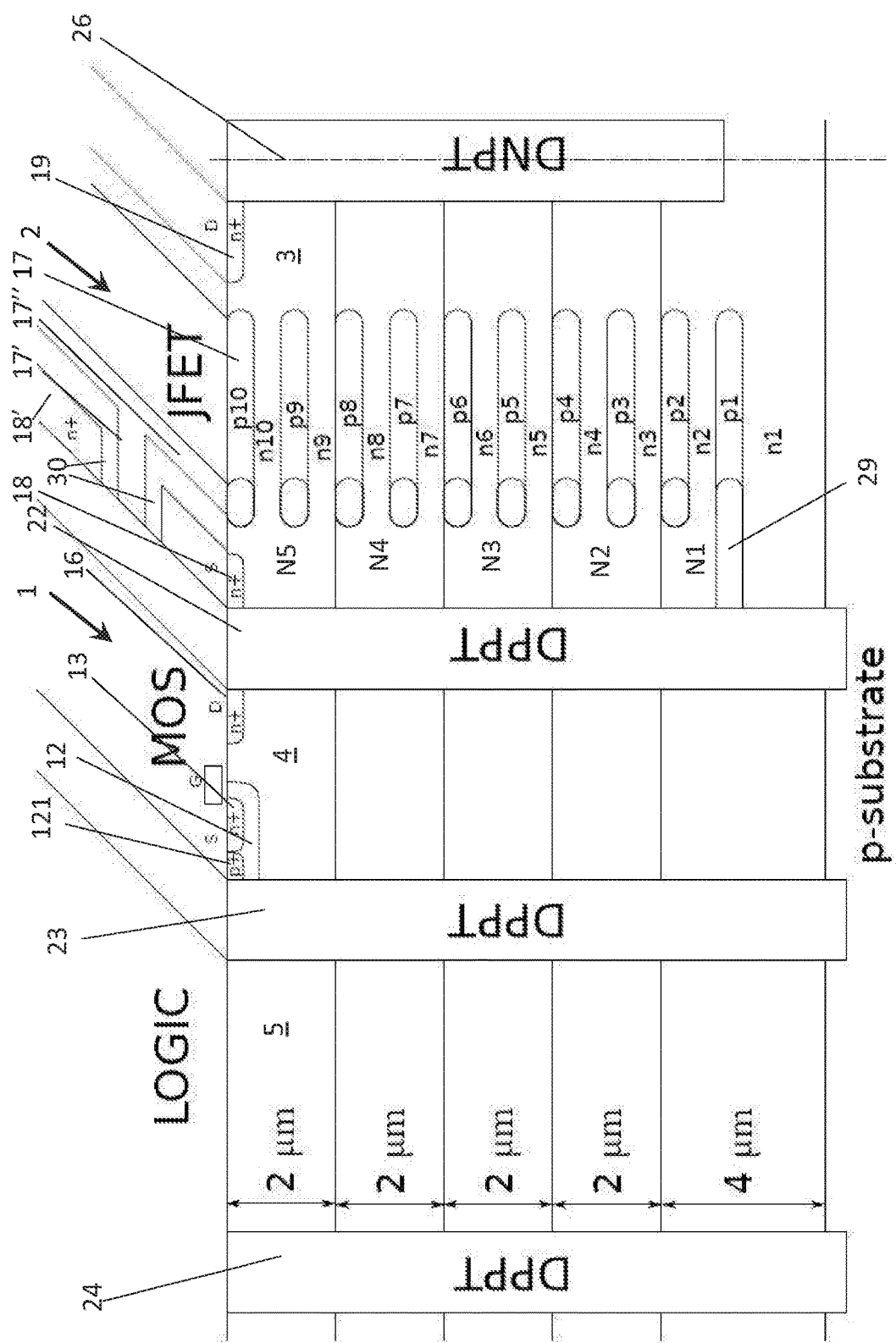
FIG. 2 shows a second embodiment of a semiconductor device according to the prior invention in the form of a MOS transistor in series with a JFET comprising several conductive layers, with two implanted p-layers in each epitaxial layer.

FIG. 2 shows a MOS transistor 1 in serial connection with a JFET 2 which comprises several conductive layers, JFET channels in parallel, conductive n-layers in the FIG. 2, and separated by patterned common p-layers, gates.

A first n-type epitaxial layer with a thickness of 2 µm is grown on top of a p-substrate resistivity ranging from 10 Ωcm to 135 Ωcm. The wafer is taken out of the reactor and two conductive layers are formed, n1 and n2, by the implanted gate layers p1 and p2.

The thickness and the doping of the layers are determined by the resurf principle which means that the product of the thickness and doping of a layer should be around $2*10^{12}$ charges/cm², which means thickness and doping can be varied as long this condition is satisfied.

The first channel region in the figure, n1, is chosen to be 0.5 µm thick with a doping of $4*10^{16}/cm^3$ and then satisfies the condition above.

The thickness and doping of the following layers are then chosen to be 0.5 µm with doping $4*10^{16}/cm^3$ and could actually be as many as one like.

As a practical example 5 epitaxial layers N1-N5 are deposited of which each has two implanted p-layers.

The channel layers on the drain side are connected together to the n+ drain implantation 3 in the surface. The channel layers on the source side are connected together to the n+ drain implantation 3 in the surface.

The JFET 2 is isolated with a deep p-poly trench, DPPT, 22, on the source side of the JFET. The DPPT 22 on the source side has fingers connecting the p-layers, p1-p10, at given intervals.

The upper p10 gate layer 17 will be put in a contact with the DPPT layer through an opening 30 in the mask creating an area where a finger 17' stretches from the gate layer and the n+ source 18, 18' contacting is disrupted. The same mask will be used for creating and contacting all other gate layers. The fingers 17' will make sure that all n layers are in contact.

Within or partly within the isolated n-region body region of first conductivity type, for example p-type material, is doped at between $1*10^{17}$ and $1*10^{18}$ atoms per cm³. The body region 12 typically extends to a depth of 1 µm or less below surface of the device.

Within the body region 12 for the MOS transistor 1 a source region 13 of second conductivity type, for example n+ type material doped at $1*10^{18}$ and $1*10^{20}$ atoms per cm³. The source region 13 extends for example 0.4 µm or less below the surface of the device. A body contact region 121 in the body region 12 to the left of source region of first conductivity type doped at between $1*10^{18}$ and $1*10^{20}$ atoms per cm³. The body contact region 121 extends for example 0.4 µm or less below the surface of the device. Both the body region 12 and the body contact region 121 may be electrically connected to the substrate by extending the body region 12 and body contact region 121 outside the pocket region.

A drain contact region 16 of second conductivity type, for example n+ type material, is doped at between $1*10^{18}$ and $1*10^{20}$ atoms per cm³. The drain contact region 16 extends, for example 0.4 µm or less below the surface.

Within the isolated region 3 for the JFET a source region 18 and a drain 19 of second conductivity type, for example n+ type material doped at $1*10^{18}$ and $1*10^{20}$ atoms per cm³ are located. The source region 18 and the drain region 19 extend for example 0.4 µm or less below the surface.

The drain contact 16 of the MOS transistor 1 will be electrically contacted to the source contact 18 of the JFET 2 and thus constitute a MOS transistor 1 in series with a JFET 2.

The breakdown voltage of the device will be determined by the drift region LD and the substrate resistivity.

As discussed earlier it can be beneficial to have the uppermost thick layer in p-type instead of n-type which is the objective of the present invention.

Figure 9:
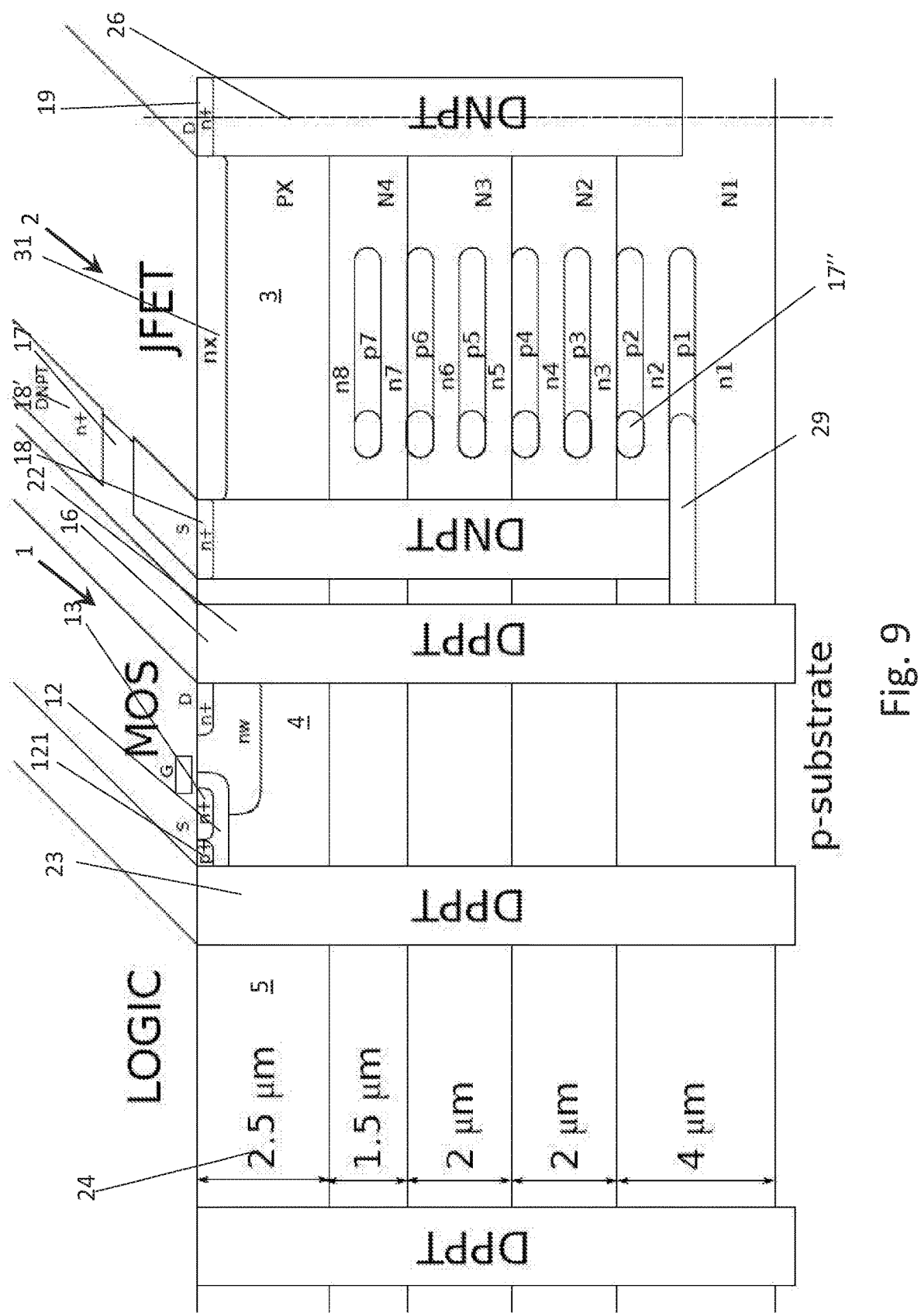
FIG. 9 shows a second embodiment of a semiconductor device according to the prior invention in the form of a MOS transistor in series with a JFET comprising several conduc tive layers, with two implanted p-layers in each epitaxial layer, similar to FIG. 2 with a p-type top layer for CMOS compatibility.

The device shown in FIG. 2 can also be modified by taking away p8 in epilayer N4, reducing the thickness of the N4 epilayer from 2 µm to 1.5 µm, and depositing a 2.5 µm thick p-epi layer PX on top with doping density of $1*10^{16}/cm^3$. On top of that a nx layer 31 is implanted with thickness 0.5 µm and charge of $1*10^{12}/cm^2$. This is shown in FIG. 9. The thickness of the underlying p-layer now being 2 µm with a charge of $2*10^{12}/cm^2$ which then corresponds to a doping density $1*10^{16}/cm^3$. The p-type regions 4 and 5 will have the same doping density with thickness 2.5 µm, this doping density is standard for state of the art CMOS. Older standard for CMOS with starting material p-type doping density of $1*10^{15}/cm^3$ can also easily be accomplished by making the p5 epitaxial layer a sandwich with two p-layers, the first 1 µm thick, with doping $2*10^{16}$ and the other on top with thickness 1.5 µm and doping $1*10^{15}$. The masked nx layer 31 should then cover the top part of the p5 layer. A DNPT is also added on the source side.

As several isolated regions can easily be made as example 5 for logic and analogue control functions.

An important requirement for the device shown in FIG. 2 to work is that the pinch voltage of any of the FETs in the JFET 2 is lower than the breakthrough voltage of the MOS transistor 1. The pinch voltage will appear on the common source 18 of the FETs and then connected to the drain 16 of the isolated MOS transistor 1. In the same way as described in FIG. 1 the first layer n1 on top of the p-substrate 11 is thicker and this is for meeting the requirement for a high breakthrough voltage. For a breakthrough voltage of around 800V the thickness of the layer should be around 6-7 µm and with a pinch voltage of 50V or more. This means that the MOS transistor would stand 50V with good margin. Also a 50V MOS transistor will take up more space with lower performance than a 10V MOS device. It is therefore suggested that the remainder of the n-layers are designed for a 10V pinch voltage to start with, and that the first layer is shielded from the source 18 of the JFET 2 by a shielding layer 29 as shown in FIG. 2.

Figure 10:
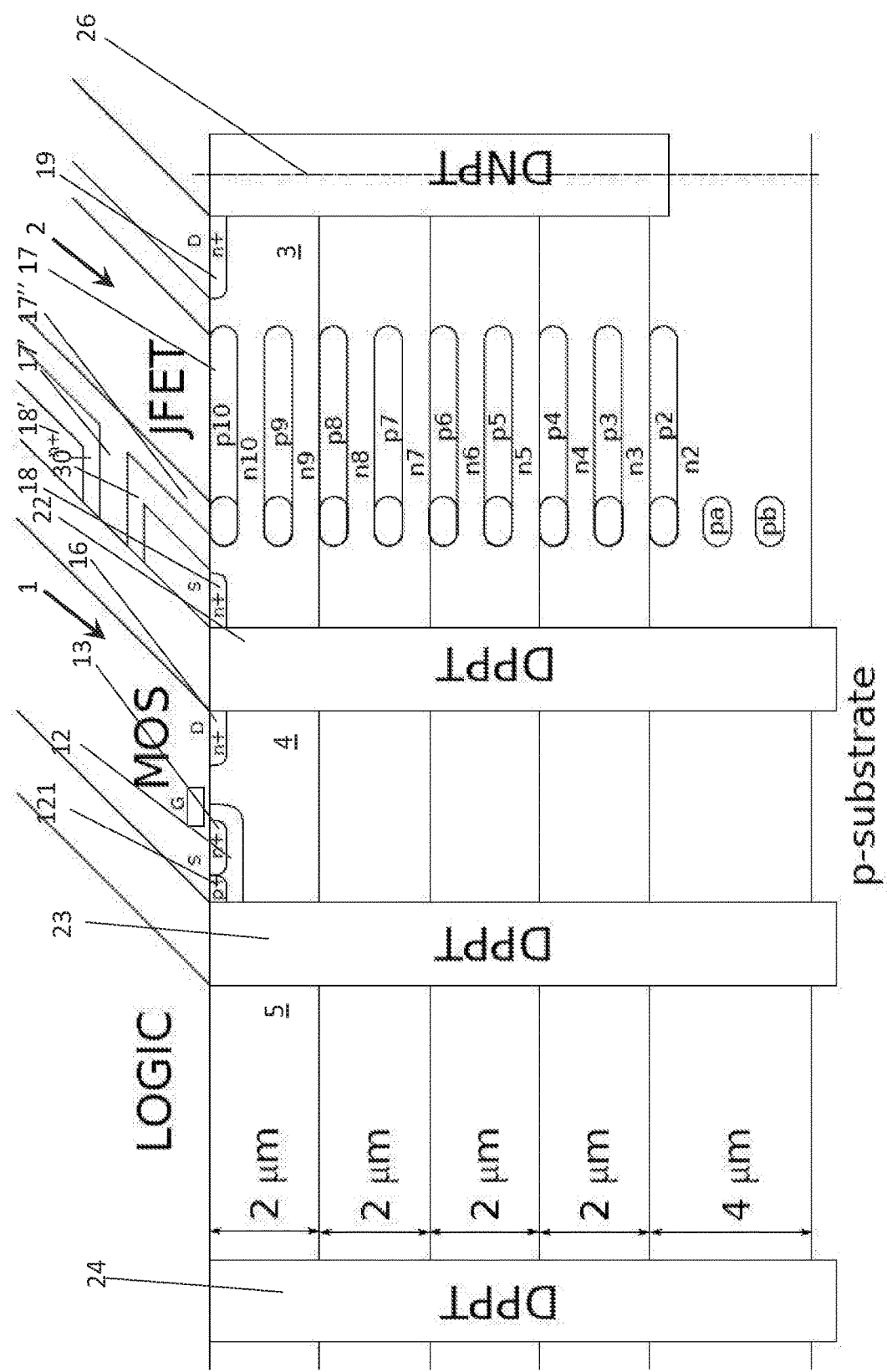
FIG. 10 shows an alternative solution to the semiconductor device shown in FIG. 2 with an additional conducting layer in the bottom layer for decreased total resistance.

To then solve the problem that there is no contribution to the current and resistance from the first layer 29 and p1 are taken away, as shown in FIG. 10. Then the thickness under p2 should be 6 µm. This layer has been named n2. Roughly in the middle of that thickness a new p region pa is placed which then creates two new channels one on top of pa and the other below pa which both will pinch well below 10 V. The two short channels will increase the resistance of the n2 layer from drain to source very marginally (10-15%). For still higher breakdown voltages which requires thicker n2 layers it is proposed adding another p-region pb and possibly more regions pc, etc until required performance is reached.

The pinch voltage, or actually the source voltage 18, of the common JFETs should be low and constant as the drain voltage 19 of the JFET is increased, e.g. up to 800V. This will not happen as there is an increase of the source voltage when the drain voltage is increased. By increasing the doping in the gate layers p1-p10 close to the JFET source 18 thus forming a shielding area 17″ along the edge of the gate layer p1-p10, and so forming a conventional FET in series with a superjunction FET, where the gate layer never will be fully depleted. This will make the source voltage 18 of the JFET 2 constant as the drain voltage of the JFET is increased up to 800V. This will further decrease the important Miller capacitance in the order of magnitude. As the doping in the indicated areas has been increased substantially, it can be used to contact the gate layer to ground much less frequently and increasing the effective width of the JFET. The charge in the shielding area can be in the order of $2*10^{13}/cm^2$.

Figure 3:
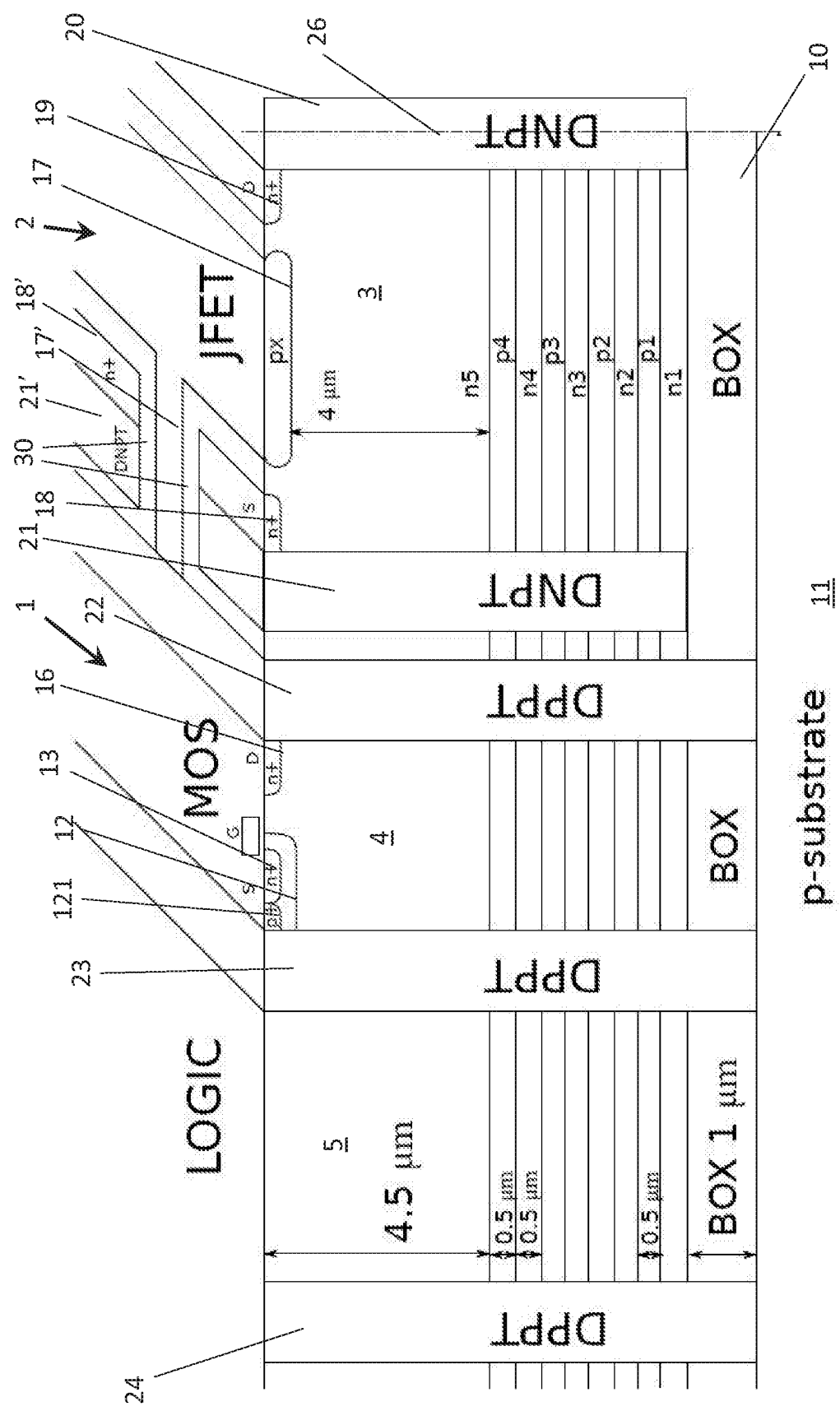
FIG. 3 shows an implementation of a device similar to FIG. 1 in a SOI technology with a BOX layer.

FIG. 3 shows a MOS transistor 1 in serial connection with a JFET 2 which comprises several conductive layers, JFET channels in parallel n-layers n1-n5 in the figure and separated by common p-layers p1-p4, gates. The layers are deposited in situ in an epitaxial reactor on top of an oxide layer 10, which is carried by a p-substrate 11. On the top of the oxide layer 10 there is a thin crystalline seed layer before starting growing the epitaxial layers n1-n5, p1-p4.

The thickness and the doping of the layers are determined by the resurf principle which means that the product of the thickness and doping of a layer should be around $2*10^{12}$ charges/$cm^2$, which means thickness and doping can be varied as long this condition is satisfied.

In the figure the epitaxial layers are started with equal thickness 0.5 µm and a doping of $4*10^{16}/cm^3$ and could actually be as many as one likes.

As a practical example the number of epitaxial layers is stopped before the n5 epitaxial layer, which is made thicker 4.5 µm, and has a masked implanted px layer 17 as an upper gate, with a thickness of 0.5 µm and a charge of $1*10^{12}$. The implanted px layer is just acting as gate for one channel which makes the channel layer 4 µm thick and with a doping density of $5*10^{15}/cm^3$.

The px gate layer 17 will be contacted by a finger 17' to DPPT 22 in the same way as for the device in FIG. 1.

The channel layers n1-n5 on the drain side are connected together with a deep N-poly trench, DNPT 20, and so also the channel layers on the source side by a deep N-poly trench, DN PT 21. The JFET 2 is isolated by a deep p-type poly trench, DPPT 22, and on the same time connecting the p-layers p1-p4, which normally will be grounded and with given intervals disrupt the source DNPT 21 for contacting p-layers p1-p4 in the other direction. In addition to the isolated region 3 additional DPPTs 23, 24 can create isolated n-islands for example, 4 and 5 in the figure.

Within or partly within the isolated n-region 4 a body region 12 of a first conductivity type, for example p-type material, is doped at between $1*10^{17}$ and $1*10^{18}$ atoms per $cm^3$. The body region 12 typically extends to a depth of 1 µm or less below surface of the device. Within the body region 12 for the MOS transistor 1 a source region 13 of a second conductivity type, for example n+ type material doped at $1*10^{18}$ and $1*10^{20}$ atoms per $cm^3$. The source region 13 extends for example 0.4 µm or less below the surface of the device. A body contact region 121 in the body region 12 to the left of the source region 12 of first conductivity type is arranged, and doped at between $1*10^{18}$ and $1*10^{20}$ atoms per $cm^3$. The body contact region 121 extends for example 0.4 µm or less below the surface of the device. Both the body region 12 and the body contact region 121 may be electrically connected to the substrate by extending the body region 12 and body contact region 121 outside the pocket region.

A drain contact region 16 of the second conductivity type, for example n+ type material, is doped at between $1*10^{18}$ and $1*10^{20}$ atoms per $cm^3$. The drain contact region 16 extends, for example 0.4 µm or less below the surface of the device.

Within the isolated region 3 for the JFET 2 a source region 18 and a drain region 19 of the second conductivity type, for example n+ type material, doped at $1*10^{18}$ and $1*10^{20}$ atoms per $cm^3$ are located. The source region 18 and the drain region 19 extend for example 0.4 µm or less below the surface of the device.

The drain contact 16 of the MOS transistor 1 will be electrically contacted to the source contact 18 of the JFET 2 and thus constitute a MOS transistor 1 in series with a JFET 2. The breakdown voltage of the device will be determined by the drift region LD.

Several isolated regions 5 can easily be made as example for logic and analog control functions.

In the embodiment shown and described in relation to FIG. 3 the epitaxial layers are on top of an oxide layer 10. Such an implementation could also be provided together with the embodiment shown and described in relation to FIG. 2, where the p-layers are implanted in the epitaxial n-layers.

A high voltage Schottky diode in parallel with the drain and ground can easily be implemented internally.

Figure 4:
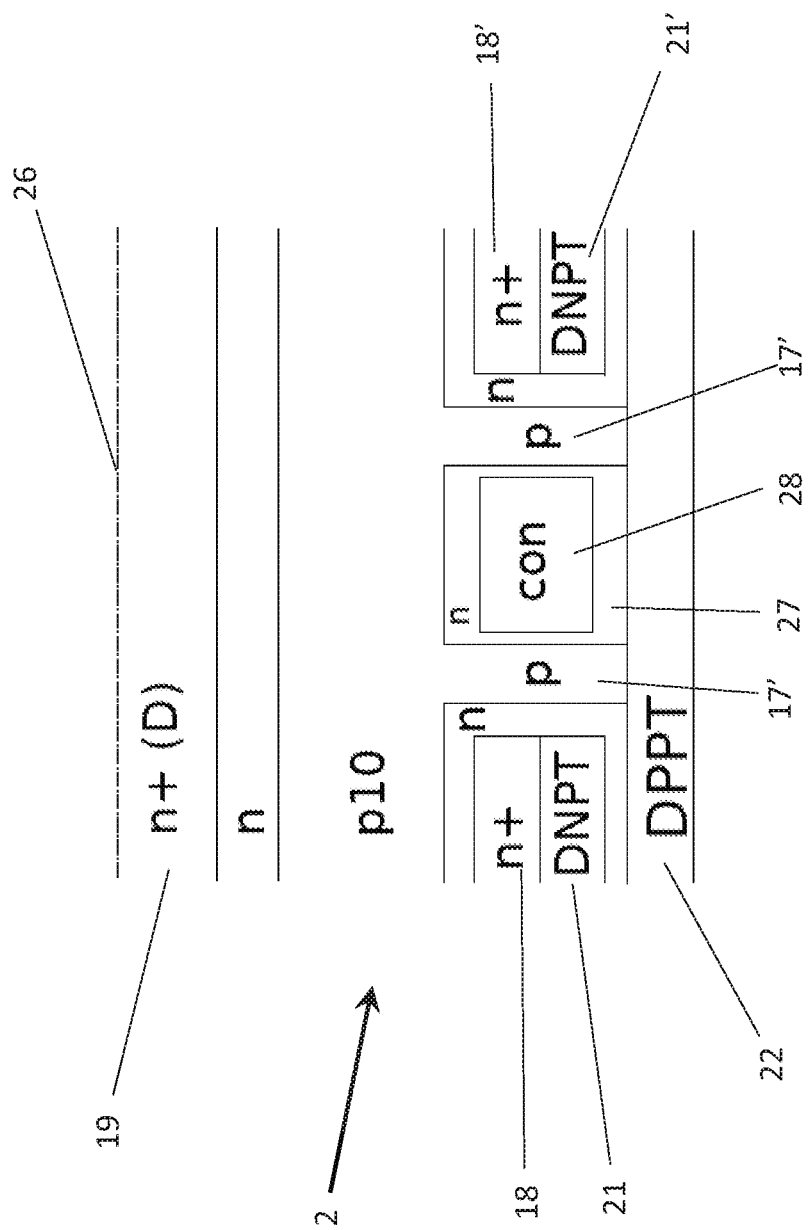
FIG. 4 shows another optional gate implantation mask for creating a Schottky diode in parallel with the drain to ground for a device according to FIG. 1 or FIG. 3.

The px finger 17' in FIG. 1 is split into two, see FIG. 4, creating an n-type surface area 27 in the middle and this contacting 28 with a Schottky metal or silicide will create a Schottky diode in parallel with the PN junction. A high performance diode is very important in many motor applications where the diode is forward biased and generate a lot of parasitic power when switched back to normal reverse condition. The diode is too slow and an integrated Schottky diode will solve that problem. It will not be necessary to use external diodes.

Figure 5:
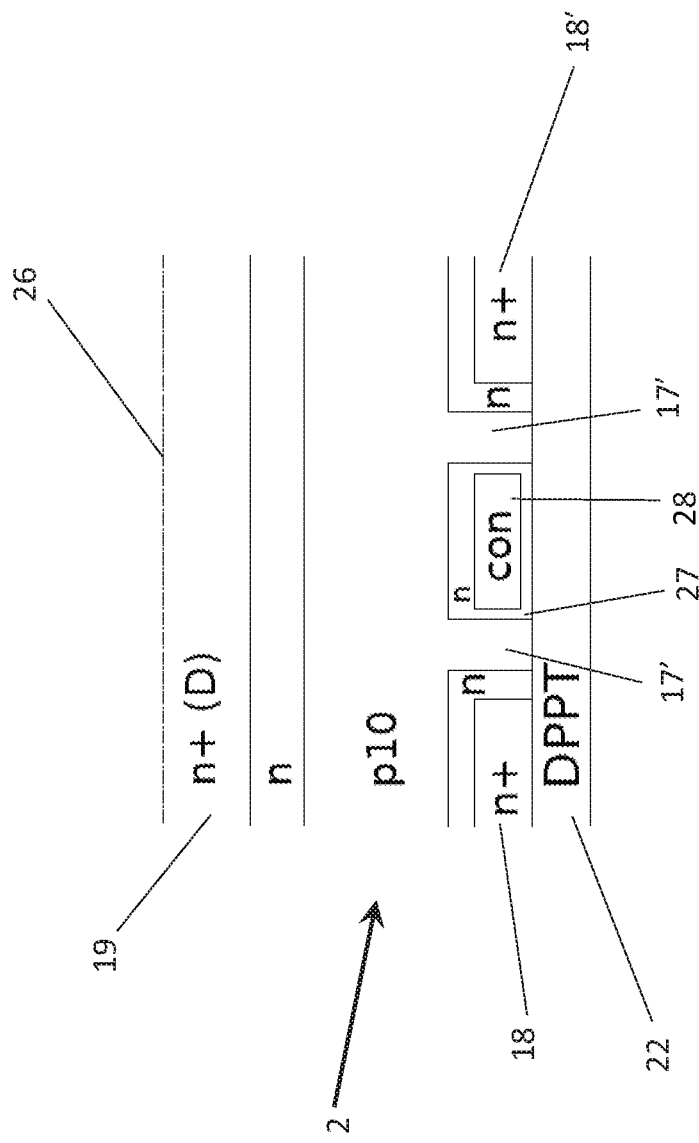
FIG. 5 shows an optional gate implantation mask for creating a Schottky diode in parallel with the drain to ground for a device according to FIG. 2.

A corresponding device is formed by using the device in FIG. 2 and splitting the p10 finger into two, see FIG. 5, creating an n-type surface area 27 in the middle and this contacting 28 with a Schottky metal or silicide will create a Schottky diode in parallel with the PN junction.

A Lateral LIGBT is a combination of a MOS transistor and a lateral PNP transistor where the MOS transistor drive the base of the PNP transistor. The device is prone to Latch-up which limits its current capability. In a conventional device the MOS transistor and lateral pnp are made in the same N-well (N-Area). By splitting the devices, a latch-free LIGBT can be generated with a dramatic increased current capability. See U.S. Pat. No. 8,264,015 B2

Figure 6:
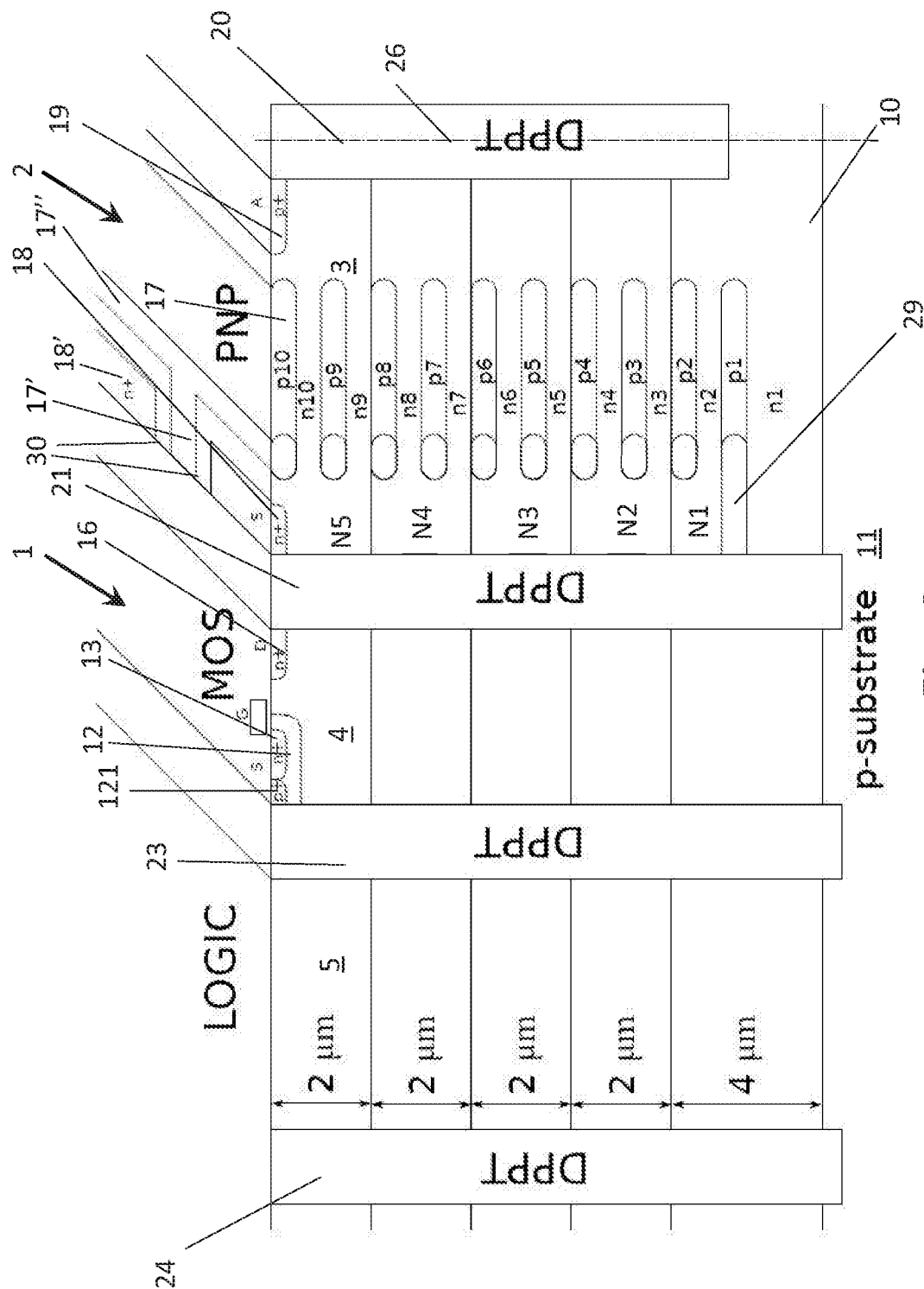
FIG. 6 shows a LIGBT device based on the device according to FIG. 2 implemented on SOI where the doping of the drain has been changed to p+, and being placed in contact with a DPPT creating a latch-free LIGBT.

In FIG. 6 the device in FIG. 2 is implemented on SOI where the doping of the drain 19 has been changed to p+ and placed in contact with a DPPT 20. This will form a lateral PNP transistor where the emitter is the p+ connected DPPT 20, the base are all conductive p-layers connected to the base contact. Collector is all gate-layers connected to DPPT 20. As the base is fed by the external MOS transistor a latch-free LIGBT with many conductive N-regions has been created which drastically should increase current capability.

In all devices which can be made symmetric, with a mirror to the right in the drawing, the reference sign 26 denotes the symmetry line.

The invention as described herein can also be modified so that all n-layers as described are replaced by p-layers, and correspondingly that all p-layer including the p-substrate are replaced by n-layers.

The invention claimed is:

1. A semiconductor device, comprising:
    a substrate of a first conductivity type that is a base for the semiconductor device;
    an insulated gate field effect transistor (IGFET) over the substrate, the IGFET being isolated with deep poly trenches of the first conductivity type (DPPTs) on both sides thereof;
    a high voltage field effect transistor (JFET) over the substrate and connected in series with the IGFET, the JFET comprising a plurality of parallel conductive layers, the JFET being isolated with a deep poly trench of a second conductivity type (DNPT) on a source side of the JFET in relation to the JFET source,
    a first conductive layer of the second conductivity type of the parallel conductive layers stretches over the substrate,
    on top of the first conductive layer of the second conductivity type are disposed a plurality of second conductive layers of the parallel conductive layers with channels formed by a plurality of doped epitaxial layers of the second conductivity type with a plurality of gate layers of the first conductivity type on both sides thereof, the plurality of second conductive layers and the channels being disposed on top of the first conductive layer; and
    another isolated region comprising logics and analogue control functions isolated with deep poly trenches of the first conductivity type (DPPTs) on both sides thereof.

2. The semiconductor device according to claim 1, wherein an uppermost conductive layer of the parallel conductive layers has a masked implanted layer of the second conductivity type at a surface of the semiconductor device.

3. The semiconductor device according to claim 1, wherein the layers of the first conductivity type that comprise doped gates of the first conductivity type on a side close to the JFET source comprise shielding areas with a higher doping than in the other part of the layers of the first conductivity type comprising the doped gates.

4. The semiconductor device according to claim 1, wherein the first layer of the second conductivity type disposed stretching over the substrate on a side close to the JFET source is provided with a shielding layer of the first conductivity type blocking any current from the first layer of the second conductivity type from reaching the JFET source via the DNPT.

5. The semiconductor device according to claim 1, wherein the first layer of the second conductivity type that stretches over the substrate on a side close to the JFET source is provided with at least one p-region in the middle of the n1-layer, creating new channels on top of and below said at least one p-region.

6. The semiconductor device according to claim 1, wherein openings are defined in a source connection region, allowing all of the gate layers of the first conductivity type to contact one of the deep poly trench DPPTs of the JFET.

7. The semiconductor device according to claim 6, wherein a finger of the first conductivity type is disposed to stretch through one of the openings in the source connection region connecting a shielding area with the one DPPT of the JFET.

8. The semiconductor device according to claim 6, wherein a finger of DPPT material is disposed to stretch through one of the openings in the source connection region connecting the one DPPT of the JFET with the gate layers of the first conductivity type at regular intervals close to the JFET source.

9. The semiconductor device according to claim 1, wherein the substrate connects to the DPPTs to act as a second gate for the first layer of the second conductivity type.

10. The semiconductor device according to claim 1, wherein the gate layers of the first conductivity type are epitaxially formed layers.

11. The semiconductor device according to claim 1, wherein the gate layers of the first conductivity type are ion-implantation formed layers in the doped epitaxial layers of the second conductivity type to result in some of the parallel conductive layers.

12. The semiconductor device according to claim 1, wherein channel layers of the conductive layers on a drain side of the JFET are connected together with another DNPT, and
wherein the channel layers on the source side of the JFET are connected together with the DNPT.

13. The semiconductor device according to claim 1, wherein a drain contact of the insulated gate field effect transistor is electrically contacted to a source contact of the JFET.

14. The semiconductor device according to claim 1, wherein the IGFET is a MOS transistor.

15. The semiconductor device according to claim 14, wherein an integrated high speed Schottky diode is connected in parallel between the DNPT and one of the DPPTs, which is implemented on the source side of the JFET by contacting an n-channel layer with Schottky metal which is isolated from the MOS transistor.

16. The semiconductor device according to claim 14, wherein the semiconductor device is a latch-free Lateral Insulated Gate Bipolar Transistor (LIGBT), in which doping of a drain of the JFET has been changed from the second conductivity type to the first conductivity type, creating a lateral PNP transistor, in which the base of the PNP is fed by the MOS transistor.

17. The semiconductor device according to claim 1, wherein the gate layers of the first conductivity type are p-layers and the doped epitaxial layers of the second conductivity type are n-layers.

18. The semiconductor device according to claim 1, wherein the gate layers of the first conductivity type are n-layers and the doped epitaxial layers of the second conductivity type are p-layers.

19. The semiconductor device of claim 1, wherein an uppermost layer of the device is substantially thicker than directly underlying conductive layers of the plurality of conductive layers.

20. The semiconductor device according to claim 19, wherein the uppermost conductive layer has a masked implanted layer of the second conductivity type at the surface of the device.

* * * * *